(12) United States Patent
Perino

(10) Patent No.: US 6,968,024 B1
(45) Date of Patent: Nov. 22, 2005

(54) APPARATUS AND METHOD FOR OPERATING A MASTER-SLAVE SYSTEM WITH A CLOCK SIGNAL AND A SEPARATE PHASE SIGNAL

(75) Inventor: Donald V. Perino, North Potomac, MD (US)

(73) Assignee: Rambus Inc., Los Altos, CA (US)

( * ) Notice: Subject to any disclaimer, the term of this patent is extended or adjusted under 35 U.S.C. 154(b) by 316 days.

(21) Appl. No.: 09/629,862

(22) Filed: Aug. 1, 2000

(51) Int. Cl.[7] .................................. H04L 7/00
(52) U.S. Cl. ............. 375/354; 375/355; 375/356; 375/371; 713/400; 713/500; 713/600
(58) Field of Search .................. 375/354, 355, 375/356, 371, 257; 716/17; 331/2; 713/500, 713/400, 600; 711/167; 395/558

(56) References Cited

U.S. PATENT DOCUMENTS

| | | | |
|---|---|---|---|
| 5,361,277 A | 11/1994 | Grover | 375/107 |
| 5,432,823 A | 7/1995 | Gasbarro et al. | |
| 5,528,187 A | 6/1996 | Sato et al. | 327/292 |
| 5,542,083 A * | 7/1996 | Hotta et al. | 709/400 |
| 5,640,547 A | 6/1997 | Hotta et al. | |
| 5,663,661 A * | 9/1997 | Dillon et al. | 326/30 |
| 5,812,835 A | 9/1998 | Ruuskanen | 395/558 |
| 6,067,594 A | 5/2000 | Perino et al. | 710/126 |
| 6,188,286 B1 * | 2/2001 | Hogl et al. | 331/2 |
| 6,426,984 B1 * | 7/2002 | Perino et al. | 375/356 |
| 6,571,346 B1 * | 5/2003 | Dreps et al. | 713/600 |
| 6,643,752 B1 * | 11/2003 | Donnelly et al. | 711/167 |
| 6,643,787 B1 * | 11/2003 | Zerbe et al. | 713/400 |

FOREIGN PATENT DOCUMENTS

WO  PCT/US01/23889  10/2001

OTHER PUBLICATIONS

Supplementary European Search Report issued on European Application No. EP 01 95 7331, dated Dec. 29, 2004.

* cited by examiner

Primary Examiner—Shuwang Liu
(74) Attorney, Agent, or Firm—Morgan, Lewis & Bockius LLP

(57) ABSTRACT

A master-slave system includes a clock and phase signal generator to produce a clock signal at a given frequency and a phase signal at an effective frequency, where the phase signal may or may not be periodic and has an effective frequency less than the given frequency. A clock line is connected to the clock and phase signal generator to carry the clock signal. A phase line is connected to the clock and phase signal generator to carry the phase signal. The phase line includes a phase-to-master path to carry a phase-to-master phase signal and a phase-from-master path to carry a phase-from-master phase signal. A master device is connected to the clock line and the phase line. A data bus is connected to the master device. A slave device is connected to the data bus, the clock line and the phase line. The slave device processes data on the data bus in response to the clock signal and the phase signal.

31 Claims, 10 Drawing Sheets

APPARATUS AND METHOD FOR OPERATING A MASTER-SLAVE SYSTEM WITH A CLOCK SIGNAL AND A SEPARATE PHASE SIGNAL

BRIEF DESCRIPTION OF THE INVENTION

This invention relates generally to digital systems. More particularly, this invention relates to a digital system in which a master device and a set of slave devices exchange data in response to a clock signal and a separate phase signal.

BACKGROUND OF THE INVENTION

FIG. 1A is a simplified illustration of a prior art synchronous bus system. The system is described in U.S. Pat. No. 5,432,823, which is assigned to the assignee of the present invention, and is hereby incorporated by reference.

The system 20 of FIG. 1A includes a clock generator 22, a master device 24, and a set of slave devices 26_A through 26_N. A transmission channel is comprised of three components: a clock-to-master path 28, a turn-around path 29, and a clock-from-master path 30. The transmission channel ends at a termination block 31, which may be implemented with a resistor. Each clock pulse from the clock generator 22 traverses from the clock-to-master path 28, through the turn-around path 29, through the clock-from-master path 30, and into the termination block 31. The turn-around path 29 can be implemented as a single package pin to which the clock-to-master path 28 and the clock-from-master path 30 are connected, provided that the created stub is relatively short.

The clock generator 22 is any standard clock source. The master device 24 is a device that can communicate with other master devices and with slave devices, and is located near the turn-around path 29. By way of example, the master device 24 may be a microprocessor, a memory controller, or a peripheral controller.

The slave devices 26 can only communicate with master devices and may be located any where along the transmission channel. The slave devices 26 may be implemented with high speed memories, bus transceivers, peripheral devices, or input/output ports.

In the system of FIG. 1A, a data/control bus 36 (sometimes referred to simply as a data bus 36) is used to transport data and control signals between the master device 24 and the slave devices 26_A through 26_N. This operation is timed by the clock signals on the transmission channel (28, 29, 30). More particularly, the master device 24 initiates an exchange of data by broadcasting an access request packet on the data bus 36. Each slave device 26 decodes the access request packet and determines whether it is the selected slave device and the type of access requested. The selected device then responds appropriately, either reading or writing a packet of data in a pipelined fashion.

In the system of FIG. 1A, the master device 24 transmits data on the bus 36 contemporaneously with clock signals on the clock-from-master path 30. In other words, the transmission of data from the master device 24 to the slave devices 26 is timed by the clock signals on the clock-from-master path 30. Conversely, each slave device transmits data contemporaneously with the clock signal on the clock-to-master path 28. That is, the transmission of data from the slave devices 26 to the master device 24 is timed by the clock signals on the clock-to-master path 28. The scheme of having clock and data signals travel in the same direction is used to reduce clock data skew.

FIG. 1B illustrates timing circuitry used to coordinate the transmission and receipt of signals within a prior art slave device 26. As shown, complementary clock signals CTM and $\overline{\text{CTM}}$, respectively on lines 28A and 28B, are received at a differential input buffer 32, the output of which is applied to the reference and phase offset inputs of a Delay-Locked Loop (DLL) 33 to generate an internal transmit clock signal on line 34. Similarly, complementary clock signals CFM and $\overline{\text{CFM}}$, respectively on lines 30A and 30B, are received at a differential input buffer 35, the output of which is applied to the reference and phase inputs of a DLL 36 to generate an internal receive clock signal on line 37. This differential buffering scheme is different than the non-differential (single-ended) buffering scheme used for data reception. Thus, prior art slave devices using this configuration are susceptible to timing skew errors between the frequency signal and the data signal.

Returning to FIG. 1A, a problem with this prior art system is that there are impedance discontinuities on the clock loop (28, 29, 30). These impedance discontinuities create standing waves on the clock loop. The standing waves cause a timing shift, which effectively changes the delay from one slave device to another, despite uniform spacing. This problem is more fully appreciated with reference to FIG. 2.

FIG. 2 illustrates the clock signal delay as a function of a slave device's position from the master device. Line 40 illustrates the nominal delay increasing at a uniform rate as the distance from the master device grows. Line 50 illustrates the effective delay created by standing waves on the clock loop. Line 50 demonstrates that different slave devices receive a non-uniform delay, despite uniform spacing. This meandering delay causes timing problems in the reading and writing of data from and to the data bus 36.

One approach to solving this problem is to incorporate calibration circuitry on each slave device 26. The problem with this solution is that it complicates the configuration of each slave device 26: it makes each slave device 26 more expensive and it results in increased power consumption at each slave device.

Another disadvantage of prior art systems is that attenuation of the clock signal amplitude is difficult to remedy. Adding buffers or making multiple copies of the clock to reduce attenuation has the undesirable effect of distorting the clock signal phase. A related disadvantage of prior art systems is that the lengths of the clock signal traces coupled to a given slave device must usually match the length of the datapath between the master and the slave device, complicating system layout.

Yet another disadvantage of prior art systems is that the distribution of the clock signal in a differential format, as shown in FIG. 1B, leads to differences between the clock and data reception circuitry within the slave device. These differences tend to produce undesirable timing skew between the clock and data. Accordingly, prior art systems either suffer the timing skew caused by differential clock distribution or constrain the clock distribution circuitry to be the same as the data distribution circuitry, which usually necessitates a non-differential (single-ended) architecture.

Accordingly, it would be highly desirable to provide an alternate mechanism for improving the timing performance in a master-slave system.

SUMMARY OF THE INVENTION

The apparatus of the invention is a master-slave system. The master-slave system includes a clock and phase signal generator to produce a clock signal at a given frequency and a phase signal at an "effective frequency," where the phase signal may or may not be periodic and has an "effective frequency" less than the given frequency. A clock line is connected to the clock and phase signal generator to carry the clock signal. A phase line is connected to the clock and phase signal generator to carry the phase signal. The phase line includes a phase-to-master path to carry a phase-to-master phase signal and a phase-from-master path to carry a phase-from-master phase signal. A master device is connected to the clock line and the phase line. A data bus is connected to the master device. A slave device is connected to the data bus, the clock line and the phase line. The slave device processes data on the data bus in response to the clock signal and the phase signal.

The invention also includes a method of operating a master-slave system. The method includes the step of generating a clock signal at a given frequency and a phase signal at an "effective frequency" less than the given frequency. The phase signal includes a phase-to-master signal and a phase-from-master signal. The master device writes data in response to the clock signal and the phase-to-master signal. The master device reads data in response to the clock signal and the phase-from-master signal.

The lower "effective frequency" phase signal does not produce standing waves which would introduce timing errors in the master-slave system. The phase signal is processed in the slave devices by known components that minimize expense and power consumption. Thus, the invention provides a low cost solution to improve timing performance in a master-slave system.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF THE INVENTION

Figure 3A:
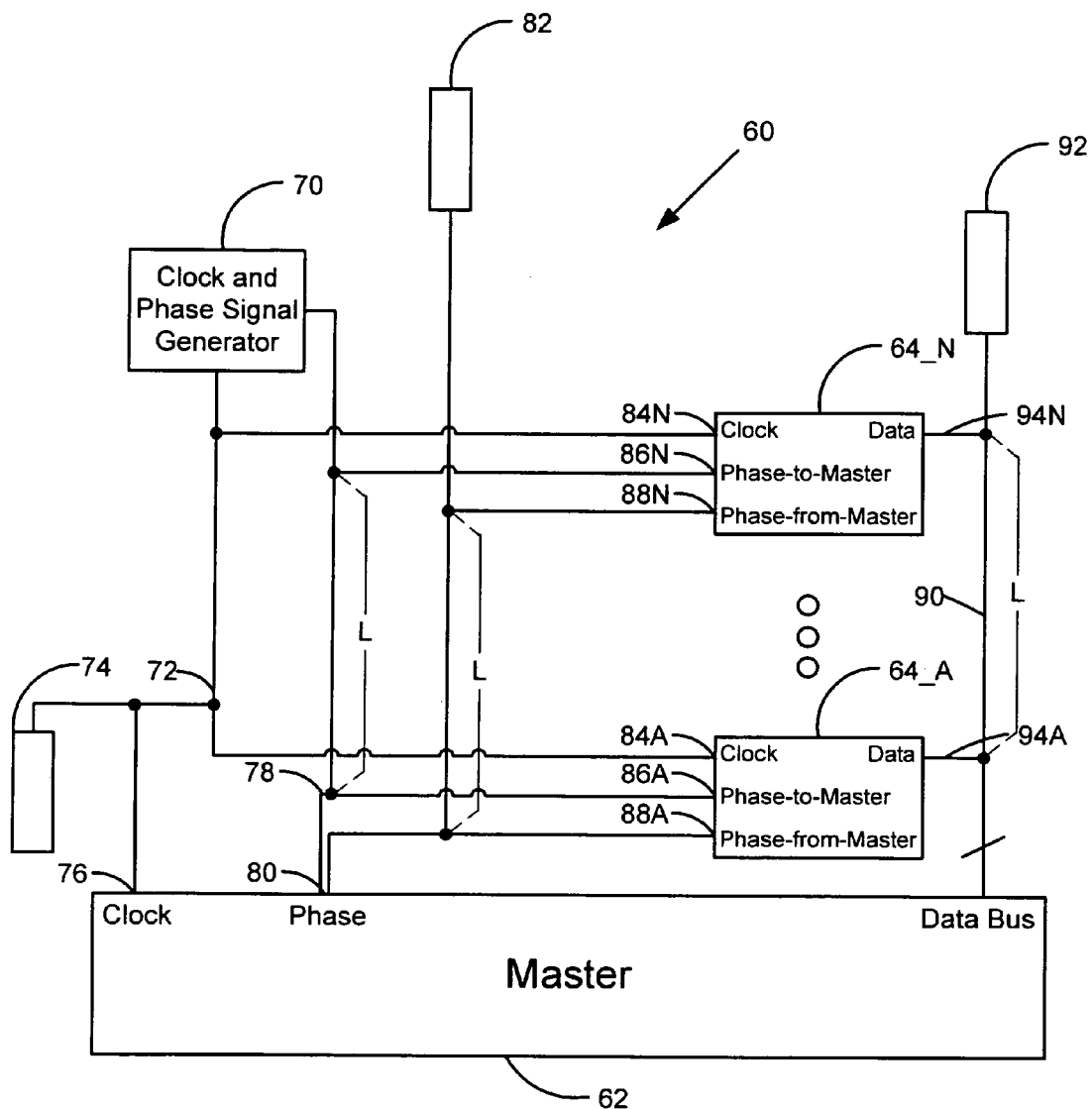
FIG. 3A illustrates a master-slave system constructed in accordance with an embodiment of the invention.

FIG. 3A illustrates a master-slave system 60 operated with a separate clock signal and phase signal in accordance with an embodiment of the invention. The system 60 includes a master device 62 (e.g., a memory controller) and a set of slave devices 64_A to 64_N (e.g., a set of memory devices): The system utilizes a clock and phase signal generator 70. As its name implies, the clock and phase signal generator 70 produces a clock signal, which is applied to line 72, and a phase signal, which is applied to line 78. The clock and phase signal generator 70 produces two distinct signals: a clock signal and a phase signal. Thus, the clock and phase signal generator 70 can be implemented with two distinct signal generating circuits: a clock generator and a phase reference generator.

Figure 1A:
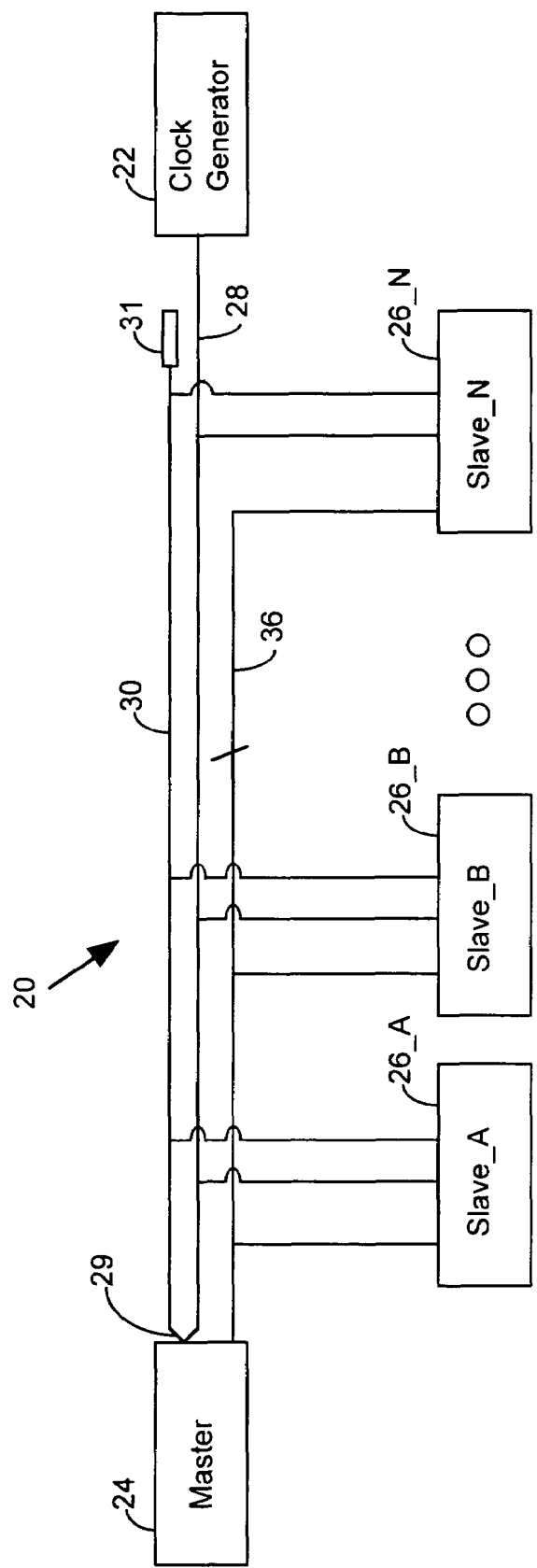
FIG. 1A illustrates a master-slave system constructed in accordance with the prior art.
Figure 1B:
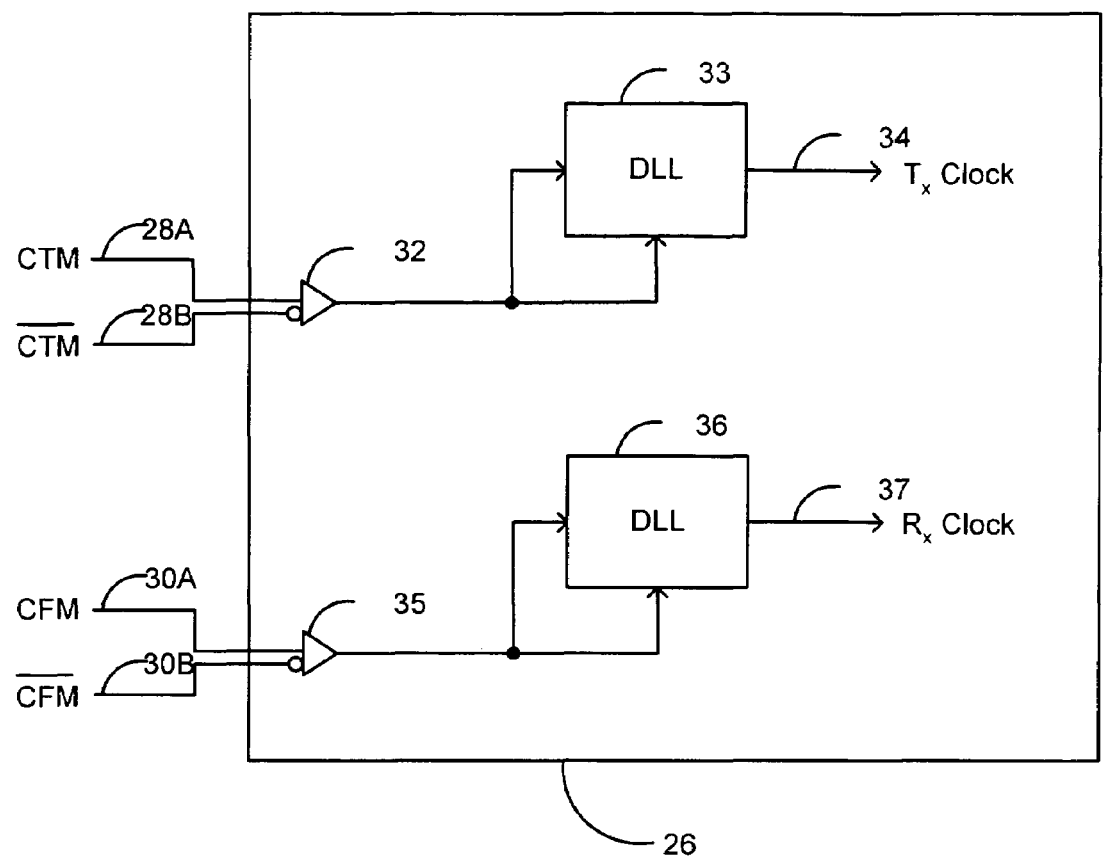
FIG. 1B illustrates a slave device constructed in accordance with the prior art.
Figure 2:
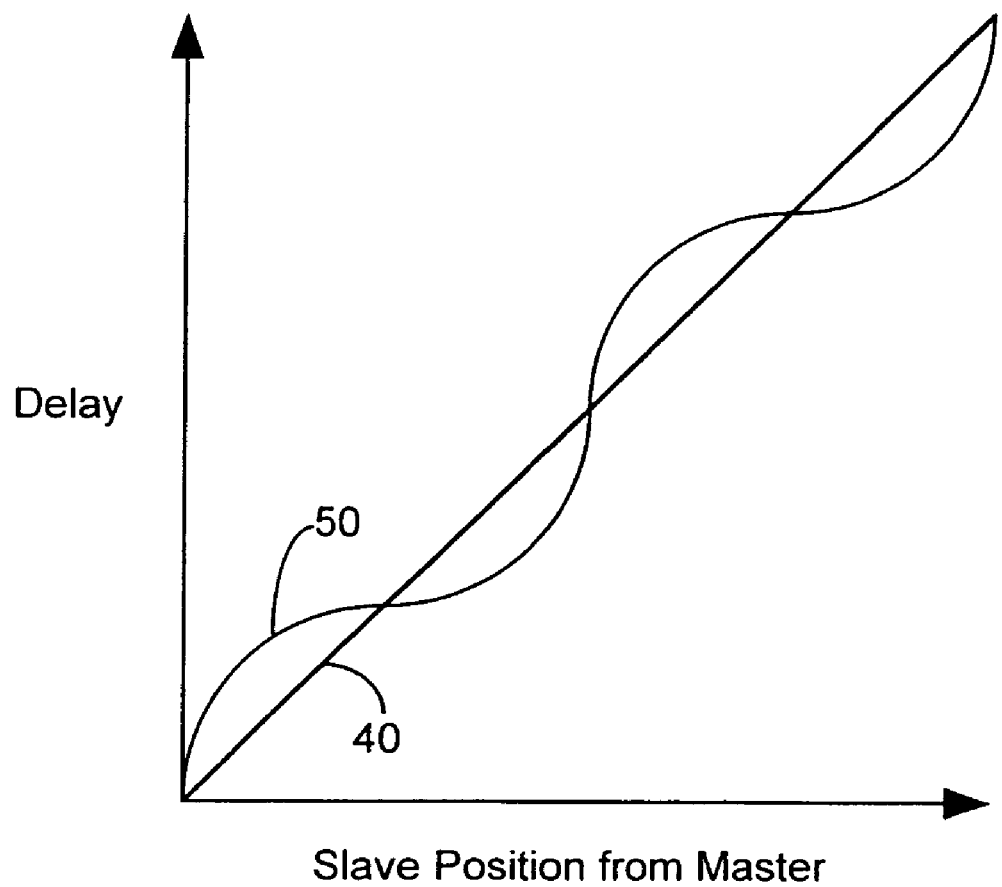
FIG. 2 illustrates the prior art problem of meandering delay between a master device and a set of slave devices arising from standing waves on a clock loop.

Observe in the prior art system of FIG. 1A that the clock generator 22 generates a single clock signal, not the separate clock and phase signals produced by the clock and phase signal generator 70. In the prior art system of FIG. 1A, the clock signal on line 28 is used to coordinate the transmission and receipt of data. With the present invention, separate clock and phase signals are used to coordinate the transmission and receipt of data.

A separate phase signal is used in accordance with the invention to avoid the prior art problem of standing waves created by high signal frequencies and impedance discontinuities. In one embodiment, the separate phase signal of the invention operates at a lower "effective frequency" than the clock signal on line 72. Herein, the phrase "effective frequency" refers to an average number of cycles per second computed over an extended (theoretically infinite) period of time. Thus, an effective frequency may be computed for both periodic and non-periodic signals. The lower effective frequency signal results in a phase line with negligible standing waves, thereby providing phase signals without timing shifts that would otherwise disrupt timing within the system.

The phase signal of the invention may be a divided-down version of the clock signal. In that case, the phase signal can be a periodic signal.

Line 72 is connected to a termination block 74, which may be implemented with a resistor. Line 72 is also connected to a clock node 76 of the master device 62. The phase line 78 has a turn around path at node 80 of the master device 62. The segment of the line 78 from the clock and phase signal generator 70 to the turn around path at node 80 forms a phase-to-master path, which carries a phase-to-master phase signal. The segment of line 78 from the turn around path at node 80 to the termination block 82 (e.g., a termination resistor) forms a phase-from-master path, which carries a phase-from-master phase signal.

Each slave device 64 has a clock node 84 connected to the clock line 72, a phase-to-master node 86 connected to the phase-to-master path of line 78, and a phase-from-master node 88 connected to the phase-from-master path of line 78. Observe that there are separate input nodes for the clock signal and the phase signals. In the prior art, phase and timing information is gathered solely from the clock-to-master and clock-from-master nodes. In contrast, with the present invention, phase and timing information is gathered from separate clock and phase nodes.

As shown in FIG. 3A, each slave device 64 further includes one or more data nodes 94 to process data carried on data bus 90. Data bus 90 preferably includes a termination block 92.

As discussed below, each slave device 64 uses the clock signal on node 84 and the phase-to-master signal on phase-to-master node 86 to transmit data to the master device 62 via data bus 90. Similarly, each slave device 64 uses the clock signal on node 84 and the phase-from-master signal to receive data via the data bus 90 from the master device 62.

FIG. 3A illustrates phase reference/data path length matching of slave devices 64_A through 64_N. Observe in FIG. 3A that the phase-to-master path between slave devices is a length "L", which is equivalent to the data bus length, "L", between the same devices. Similarly, the phase-from-master path between slave devices is the length "L", which is equivalent to the data bus length between the same devices. The length of the clock signal path does not have to be matched to the length of the data bus, as is the case in prior art systems. Thus, the clock signal path can be flexibly routed in a variety of ways.

Figure 3B:
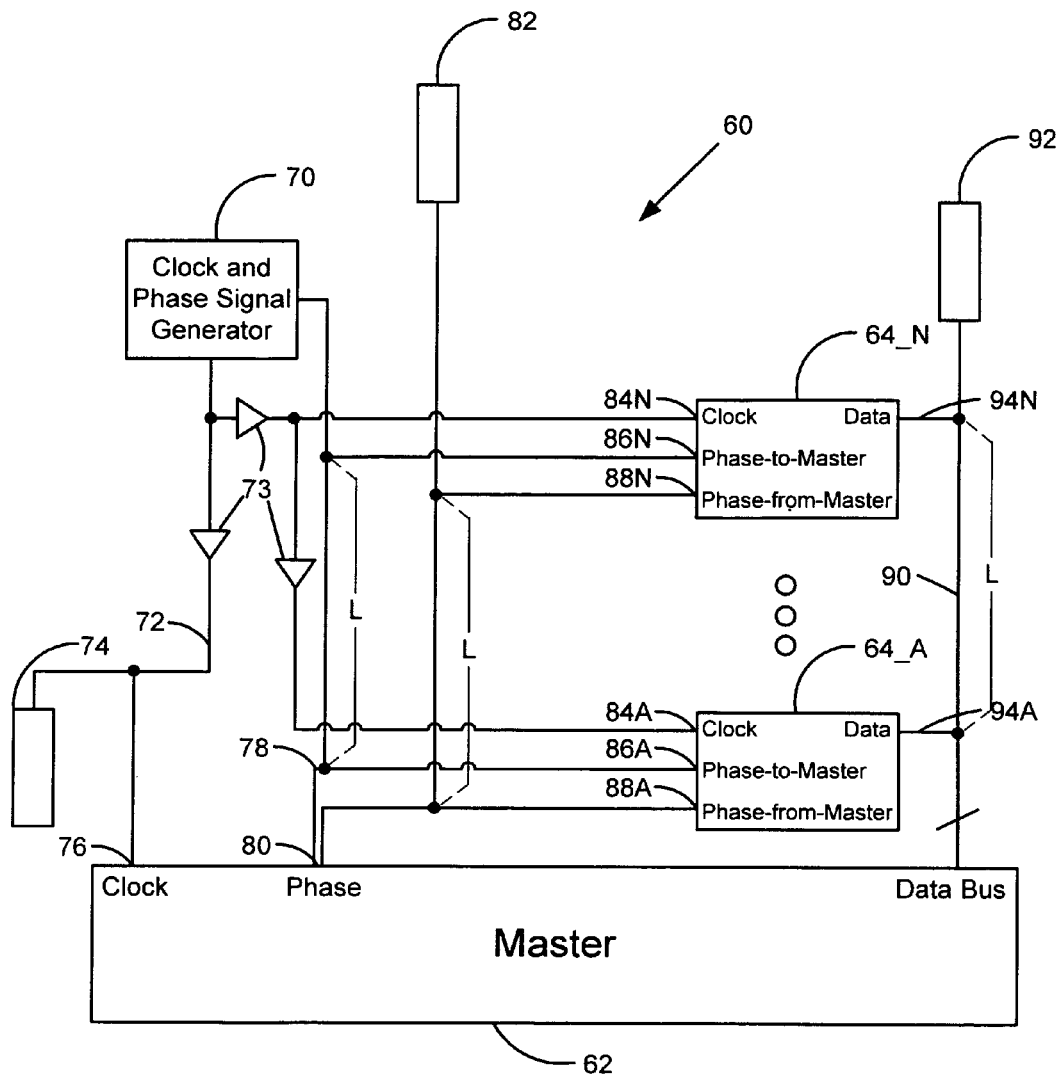
FIG. 3B illustrates a master-slave system constructed in accordance with another embodiment of the invention

FIG. 3B illustrates differential signal buffers 73 to route a differential clock signal from the clock and phase signal generator 70. Thus, in accordance with the invention, a slave device can process a differential clock signal and a non-differential (single-ended) phase signal. This results in system design flexibility, as discussed below. In addition, the clock signal can be buffered, as desired, since skew between the clock signal and data signal does not have to be minimized, as is the case in prior art systems.

Figure 4:
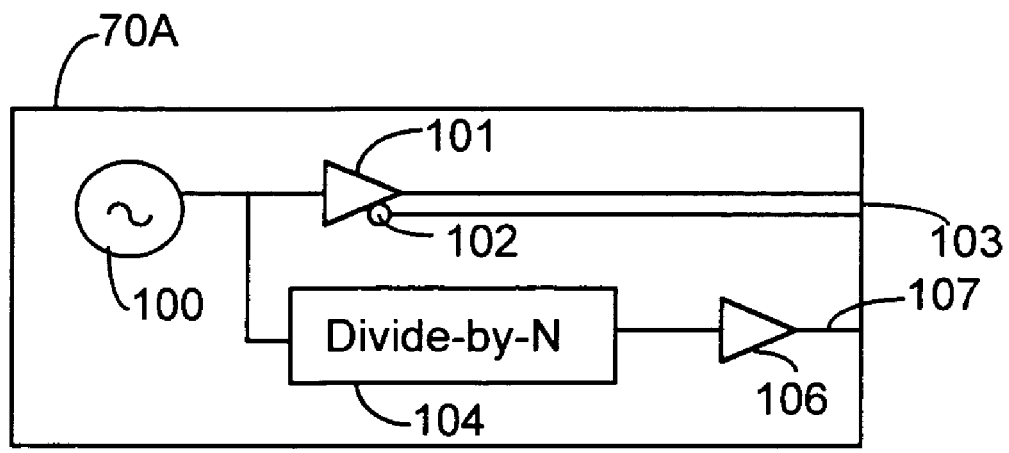
FIG. 4 illustrates a clock and phase signal generator constructed in accordance with an embodiment of the invention.

FIG. 4 illustrates an implementation of the clock and phase signal generator 70. The circuit 70 includes a clock source 100. The clock signal from the clock source 100 may be buffered at buffer 101. In a differential signaling mode, an inverting node 102 of the buffer 101 is used to produce an inverted version of the clock signal. The clock signal and the inverted signal are applied to line 72 via nodes 103. Thus, a clock signal generator of the invention includes a clock source 100, and optionally, a buffer 101.

FIG. 4 also illustrates that the circuit 70 includes a divide-by-N circuit 104 to divide down the clock signal from the clock source 100. The divide-by-N circuit 104 produces a lower frequency phase signal that will not produce standing waves on the phase line 78. The divide-by-N circuit may produce a fractional number (e.g., 3.5). Thus, the divide-by-N-circuit may be viewed as an M/N divider, where M and N are each integers.

By way of example, in a 400 MHz system a clock cycle has a period of 2.5 ns. If a divide by 16 circuit is used, the phase signal has a period of 40 ns. A signal of this type will not produce standing waves on the phase line 78. Preferably, the lower frequency phase signal is processed with a buffer 106 prior to being applied to the phase line 78 via node 107. Thus, in one embodiment of the invention, a phase signal generator includes a clock source 100, a divide-by-N circuit 104, and a buffer 106.

The clock and phase signal generator 70B of FIG. 4 produces a phase signal that is periodic in nature. The remaining embodiments of the clock and phase signal generator produce a phase signal that is non-periodic.

Figure 5A:
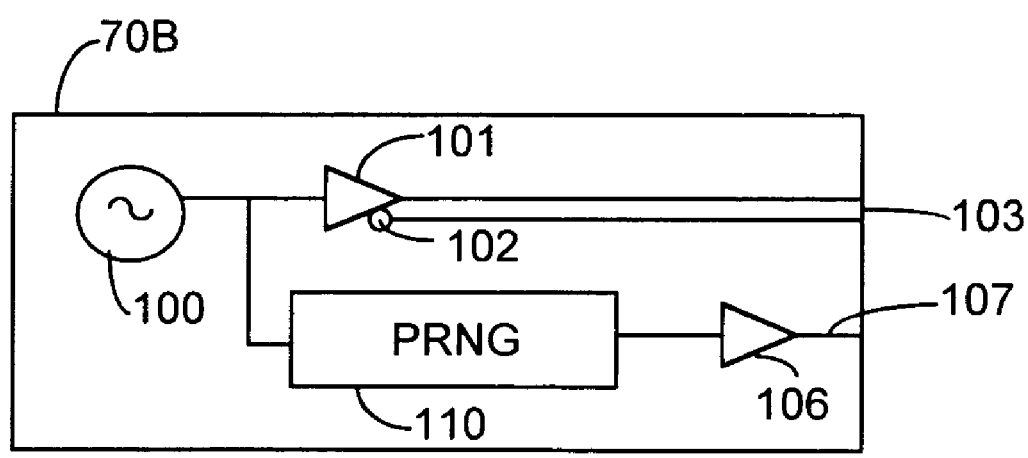
FIG. 5A illustrates a clock and phase signal generator constructed in accordance with another embodiment of the invention.

FIG. 5A illustrates an alternate embodiment of the clock and phase signal generator 70. The circuit of FIG. 5A has the same components as the circuit of FIG. 4 with the exception that the divide-by-N circuit 104 is replaced with a pseudo random number generator 110. The pseudo random number generator 110 generates a non-periodic or non-continuous spread spectrum signal. Thus, the phase signal produced by the generator of FIG. 5A does not have a single frequency. Nevertheless, this signal can be used as a reference signal to coordinate the receipt and transmission of data, as discussed below. The non-periodic or non-continuous signal is useful in various noise reduction or power saving schemes.

Figure 5B:
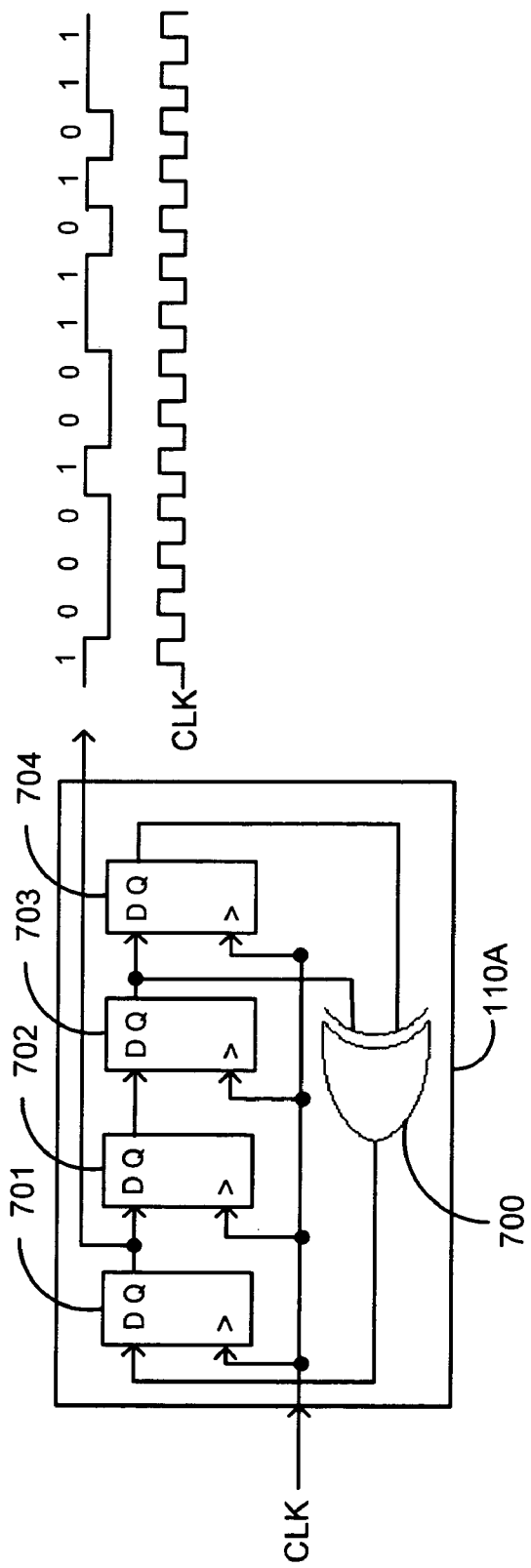
FIG. 5B illustrates a pseudo random number generator and an associated timing diagram for one embodiment of the invention.
Figure 5C:
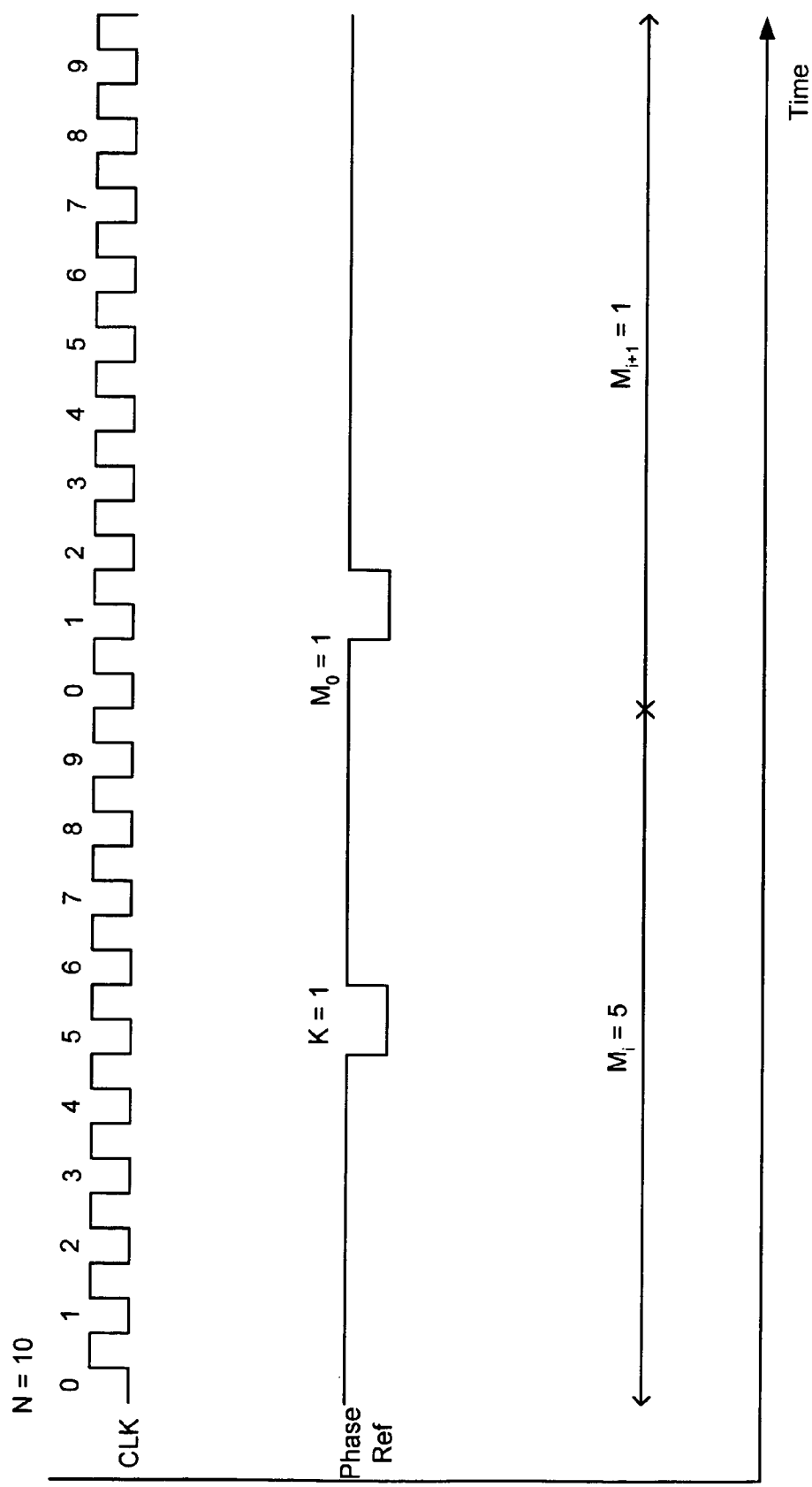
FIG. 5C illustrates the timing diagram of a pseudo random number generator utilized in accordance with another embodiment of the invention.
Figure 5D:
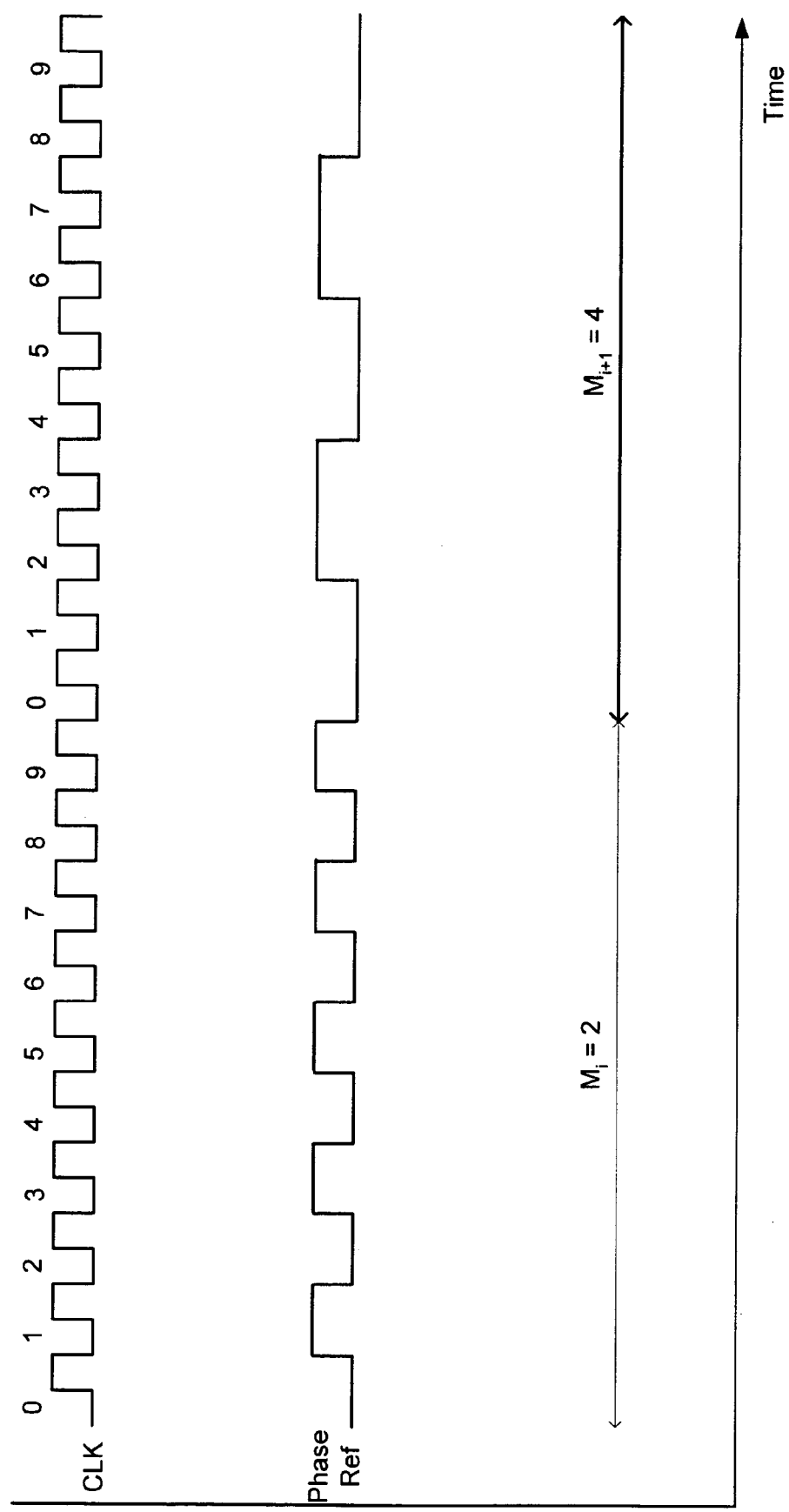
FIG. 5D illustrates the timing diagram of a pseudo random number generator utilized in accordance with still another embodiment of the invention.

The concept behind the pseudo random number generator 110 is that so long as the phase reference cycles at least once every N cycles of the clock signal proper phase lock can be maintained by the slave delay-locked loops. FIGS. 5B, 5C, and 5D illustrate timing diagrams for three different embodiments of the pseudo random generator 110.

Effective frequency can be explained with reference to FIG. 5B. Pseudo random number generator 110A consists of four flip-flops 701–704 that together form a linear feedback shift register (LFSR), and an exclusive-OR (XOR) gate 700, with inputs from the flip-flops 703 and 704 and an output to the flip-flop 701. The XOR gate 700 produces a digital high output when the outputs of flip-flops 703 and 704 are opposite, otherwise a digital low output signal is produced, this results in the following pattern at the output of flip-flop 701: 100010011010111, as shown in FIG. 5B. Thus, even with a periodic input clock signal, CLK, the output of the pseudo random number generator 110A is not periodic. The output signal provides only phase information, not clock information. Thus, it has an effective frequency, but is not periodic.

For the circuit 110A of FIG. 5B, the number of flip-flops/bits is preferably less than N, where N is the maximum number of clock cycles that can transpire without a transition of the phase reference without the loss of phase lock. The LFSR must have a transition at least once every K clock cycles, where K is the number of flip-flops in the LFSR. Naturally, other circuits may be used to implement a pseudo-random number generator, as appreciated with reference to FIGS. 5C and 5D.

FIG. 5C illustrates timing diagrams for an alternate pseudo random generator used in accordance with an embodiment of the invention. In the scheme of FIG. 5C, the pseudo random number generator is configured to output a new value M after each N cycles of the clock, CLK. The value M indicates the phase reference signal is to transition, e.g. from high to low, at the Mth cycle of the N cycles. The phase reference signal (Phase Ref) transitions, e.g. from low to high, after K cycles or at least before N cycles of CLK. In FIG. 5C, K=1. So, if the pseudo random number generator randomly specifies a number between 1 and N (a new number M after every N cycles of the clock signal), phase lock is maintained using a non-periodic phase reference signal that can be described as having an effective frequency. Assuming complete randomness in the value of M, the effective frequency of the phase reference signal converges to the clock frequency/N. With this approach, the effective frequency is the average number of cycles per second of the phase reference signal over an extended period of time.

FIG. 5D illustrates the use of a pseudo random number generator configured to output a value M used to divide the frequency of the clock signal, CLK. A new value M is specified every N cycles. Preferably, M ranges randomly between 1 and N/2. In this embodiment, the signal has no fixed period over time intervals greater than N clock cycles, but does exhibit limited periodicity within selected intervals of N clock cycles.

Figure 6:
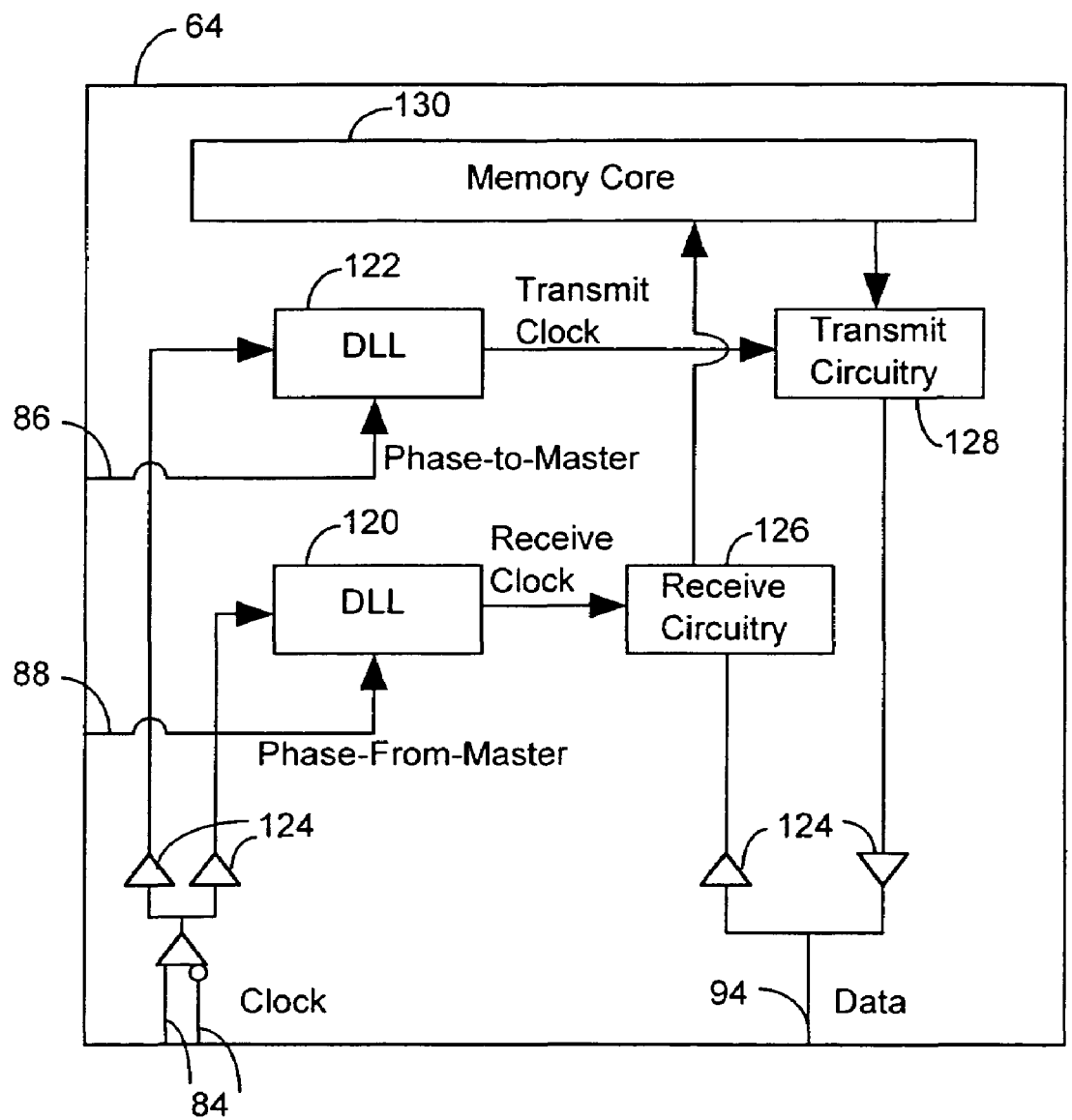
FIG. 6 illustrates a slave device constructed in accordance with an embodiment of the invention.

FIG. 6 illustrates a slave device 64 constructed in accordance with an embodiment of the invention. The figure illustrates a clock node 84 to receive a single-ended or differential clock signal. The figure also illustrates a phase-to-master node 86 to receive a phase-to-master signal, which may be a single ended or differential signal. The slave device 64 also includes a phase-from-master node 88 to receive a phase-from-master signal, which may be a single ended or differential signal. Advantageously, the present invention allows single-ended phase signals. Prior art master-slave systems typically require that the phase information be acquired from the same buffer used to receive the clock signal. In some systems it is advantageous to use a differential mode clock even though this tends to produce skew between the clock input buffer and non-differential data input buffers. It is advantageous to design the phase input buffers to be as identical as possible to the data input buffers. The present invention provides this type of design flexibility.

As shown in FIG. 6, a first delay-locked loop 120 processes the clock signal and the phase-from-master signal to produce a receive clock signal, which is applied to receive circuitry 126. The receive circuitry 126, responsive to the receive clock signal, receives data from node 94, which is attached to the data bus 90 of FIG. 3. In the case of a slave device that is a memory, the receive circuitry 126 routes the data to the memory core 130.

A second delay-locked loop 122 processes the clock signal and the phase-to-master signal to produce a transmit clock signal, which is applied to transmit circuitry 128. The transmit circuitry 128, responsive to the transmit clock signal, transmits data to node 94, which is attached to the data bus 90. In the case of a slave device that is a memory, the transmit circuitry 128 routes the data from the memory core 130.

Each delay-locked loop operates to align the received clock signal to the relevant phase signal for optimum data recovery and transmission. By using a random phase reference signal and a phase distribution line constructed to match the physical attributes of the data lines, the parasitic effects will match; therefore, the delay locked loop output will be automatically adjusted for optimum signaling margin.

Those skilled in the art will recognize a number of advantages associated with the present invention. The lower effective frequency phase signal does not produce standing waves which would introduce timing errors in the master-slave system. The phase signal is processed in the slave devices by known components (such as a delay-locked loop) that minimize expense and power consumption. Thus, the invention provides a low cost solution to improve timing performance in a master-slave system.

Observe that with the present invention, the clock line 72 may have an arbitrary topology since the clock phase is not relevant. This allows for more flexibility in system layout. Another advantage associated with the invention is that the clock can be buffered. Thus, with the present invention, the clock can be buffered and routed as desired. In many prior art master-slave systems, the clock and data signals must be constructed in the same manner. With the present invention, one may design a system to produce a clock signal with a larger amplitude than the phase reference signal.

Another advantage of the present invention is the there is a great deal of design flexibility in the buffering circuitry of the slave devices. That is, different buffering schemes can be used for the clock signal, the phase signal, and the data signal. These buffering schemes can be matched or mismatched, as desired. In contrast, in the prior art, the buffering for the clock and phase signals is unitary and therefore results in various design tradeoffs. For example, if the clock and phase signal buffering matches the data reception buffering, then a single-ended scheme must be used. If the clock and phase signal buffering does not match the data reception buffering, timing skew problems arise. This timing skew is avoided with the present invention by having the phase signal and data signal buffers in an identical configuration, while the clock signal buffering is optimized in a separate configuration, e.g., a differential signal buffering configuration.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A slave device for use in a master-slave system, comprising:
   a clock node to receive an externally-provided clock signal;
   a phase-to-master node to receive a phase-to-master phase signal; and
   a phase-from-master node to receive a phase-from-master phase signal;
   wherein the externally-provided clock signal, the phase-to-master phase signal and the phase-from-master phase signal are distinct signals received at distinct nodes of the slave device; and
   wherein said slave device includes a delay-locked loop configured to process said clock signal and said phase-to-master signal to produce a transmit clock signal.

2. The slave device of claim 1 wherein said slave device includes transmit circuitry to transmit data to a data bus in response to said transmit clock signal.

3. The slave device of claim 1 wherein said slave device includes a delay-locked loop configured to process said externally-provided clock signal and said phase-from-master signal to produce a receive clock signal.

4. The slave device of claim 3 wherein said slave device includes receive circuitry configured to receive data from a data bus in response to said receive clock signal.

5. The slave device of claim 1, wherein said phase-to-master signal and said phase-from-master signal each have an effective frequency that is lower than a frequency of said clock signal.

6. The slave device of claim 1 wherein said slave device is configured to process a single-ended phase-to-master phase signal.

7. The slave device of claim 1 wherein said slave device is configured to process a single-ended phase-from-master phase signal.

8. The slave device of claim 1, wherein said slave device is an integrated circuit device.

9. The slave device of claim 1, wherein said slave device is a memory device.

10. A master-slave system, comprising:
    a clock signal generator configured to produce a clock signal;
    a phase signal generator configured to produce a phase signal;

a clock line connected to said clock signal generator to carry said clock signal;

a phase line connected to said phase signal generator to carry said phase signal, said phase line including a phase-to-master path to carry a phase-to-master phase signal and a phase-from-master path to carry a phase-from-master phase signal;

a master device connected to said clock line and said phase line;

a data bus connected to said master device; and a slave device connected to said data bus, said clock line and said phase line, said slave device configured to process data on said data bus in response to said clock signal, said phase-from-master phase signal and said phase-to-master phase signal;

wherein said phase signal has an effective frequency that is lower than a frequency of said clock signal.

11. The master-slave system of claim 10 wherein said slave device includes a delay-locked loop to process said clock signal and said phase-to-master phase signal to produce a transmit clock signal.

12. The master-slave system of claim 11 wherein said slave device includes transmit circuitry to transmit data to said data bus in response to said transmit clock signal.

13. The master-slave system of claim 10 wherein said slave device includes a delay-locked loop to process said clock signal and said phase-from-master phase signal to produce a receive clock signal.

14. The master-slave system of claim 13 wherein said slave device includes receive circuitry to receive data from said data bus in response to said receive clock signal.

15. The master-slave system of claim 10 wherein said phase signal generator includes a divide-by-N effective-frequency circuit to produce said phase signal from said clock signal.

16. The master-slave system of claim 10 wherein said phase signal is non-periodic.

17. The master-slave system of claim 10 wherein said phase signal generator includes a pseudo-random number generator to produce said phase signal from said clock signal.

18. The master-slave system of claim 10, wherein said master device is a memory controller and said slave device is a memory device.

19. A method of operating a master-slave system, said method comprising:

generating a clock signal and a phase signal, said phase signal including a phase-to-master signal and a phase-from-master signal;

at an interface of a slave device, receiving said clock signal, said phase-from-master signal and said phase-to-master signal;

at the slave device, transmitting data to a master device in response to said clock signal and said phase-to-master signal;

at the slave device, receiving data from said master device in response to said clock signal and said phase-from-master signal; and producing a receive clock signal having a frequency determined by said clock signal and a phase determined by said phase-from master signal.

20. The method of claim 19 wherein said phase signal has an effective frequency that is lower than the frequency of said clock signal.

21. The method of claim 19 wherein said receiving data comprises:

operating receive circuitry in response to said receive clock signal.

22. The method of claim 19 wherein said generating includes generating said phase signal from said clock signal.

23. The method of claim 22 wherein said generating includes generating said phase signal as an effective-frequency-divided clock signal.

24. The method of claim 22 wherein said generating includes generating said phase signal as a pseudo-random function of said clock signal.

25. The method of claim 22 wherein said phase signal is non-periodic.

26. The method of claim 19, wherein said master device is a memory controller and said slave device is a memory device.

27. The method of claim 19 wherein said phase signal is non-periodic.

28. The method of claim 19 wherein said transmitting data comprises:

producing a transmit clock signal having a frequency by said clock signal and a phase determined by said phase-to-master signal.

29. The method of claim 28 wherein said transmitting data comprises:

operating data transmit circuitry in response to said transmit clock signal.

30. A system, comprising:

a clock signal generator configured to produce a clock signal;

a phase signal generator configured to produce a phase signal;

a clock line connected to said clock signal generator to carry said clock signal;

a phase line connected to said phase signal generator to carry said phase signal, said phase line including a first path to carry a first phase signal and a second path to carry a second phase signal;

a first device connected to said clock line and said phase line;

a data bus connected to said first device; and a second device connected to said data bus, said clock line and said phase line, said second device configured to process data on said data bus in response to said clock signal, said first phase signal and said second phase signal;

wherein said second device includes a delay-locked loop to process said clock signal and said first phase signal to produce a transmit clock signal.

31. A method of operating a system having a first device and a second device, said method comprising:

generating a clock signal and a phase signal, said phase signal including a first phase signal and a second phase signal;

at an interface of the second device, receiving said clock signal, said first phase signal and said second phase signal;

at the second device, transmitting data to the first device in response to said clock signal and said first phase signal;

at the second device, receiving data from the first device in response to said clock signal and said second phase signal; and producing a receive clock signal having a frequency determined by said clock signal and a phase determined by said second phase signal;

wherein said first phase signal and said second phase signal each have an effective frequency that is lower than a frequency of said clock signal.

* * * * *